United States Patent [19]

Komiak

[11] Patent Number: 5,111,157
[45] Date of Patent: May 5, 1992

[54] POWER AMPLIFIER FOR BROAD BAND OPERATION AT FREQUENCIES ABOVE ONE GHZ AND AT DECADE WATT POWER LEVELS

[75] Inventor: James J. Komiak, Lansing, N.Y.

[73] Assignee: General Electric Company, Syracuse, N.Y.

[21] Appl. No.: 694,410

[22] Filed: May 1, 1991

[51] Int. Cl.⁵ .............................................. H03F 3/60
[52] U.S. Cl. ................................... 330/286; 330/307; 330/295
[58] Field of Search ................. 330/53, 54, 55, 124 R, 330/277, 286, 295, 302, 307

[56] References Cited
U.S. PATENT DOCUMENTS 4,543,535  9/1985  Ayasli .............................. 330/286 X
4,788,509  11/1988  Bahl et al. ........................ 330/286 X Primary Examiner—Steven Mottola
Attorney, Agent, or Firm—Richard V. Lang; Paul Checkovich; Fred Jacob

[57] ABSTRACT

An octave band decade watt power amplifier is disclosed using compact and efficient MMIC fabrication techniques. The power amplifier is a two stage amplifier in which the driver transistor has two cells, and the power transistor has four cells, with each power cell double the size of the driver cells. Both transistors are of an optimized topology facilitating efficient broad band operation at matchable impedance levels. They are interconnected by three four section impedance matching networks of which the input network is coupled to a 50 ohm signal input terminal. The input and the interstage network are both formed on the same substrate as the transistors. The output network is formed on a separate substrate having a high dielectric constant (i.e. 37) which facilitates efficient and compact matching of four power transistor cells to a single output terminal for connection to a load at the conventional (50 ohm) impedance.

16 Claims, 8 Drawing Sheets

POWER AMPLIFIER FOR BROAD BAND OPERATION AT FREQUENCIES ABOVE ONE GHZ AND AT DECADE WATT POWER LEVELS

BACKGROUND OF THE INVENTION

1. Field of the Invention

The invention relates to power amplifiers for broad band high power operation at frequencies above one GHZ and constructed using MMIC fabrication techniques.

2. Prior Art

The term "Monolithic Microwave Integrated Circuit" (MMIC) implies a compact circuit which performs at microwave frequencies, and which uses a fabrication technique in which passive and active components are formed in place upon a substrate of a monocrystalline material, such as gallium arsenide, convertible to a semiconductor. Such circuits achieve performance at frequencies at 1 GHZ and above, which is not easily matched in circuits using discrete components. The discrete components, though miniaturized, must usually be interconnected by leaded connections which form unassimilable reactances at such frequencies. The MMIC designs avoid discrete components, and instead form them in place on an insulating region of the substrate. The resulting MMIC arrangement is compact and compactness leads to efficiency. The substrate connections frequently become true transmission lines and the dimensions which affect electrical properties, are selected to set impedance levels, reactances, and resonances.

Both signal gain and power transfer must be optimized in a MMIC power amplifier. The efficient transfer of power from a generator to a load requires matching the impedance of the load to the internal impedance of the generator. The standard for RF signal networks remains 50 ohms even at microwave frequencies and the standard has unquestioned practical advantages. Thus even at gigahertz frequencies, a power amplifier will be expected to have RF signal voltage gain, and to match the 50 ohm transmission line from which it derives its input signal and the 50 ohm transmission line into which it couples its output signal. (The impedance match implies the coupling of RF power from generator to load with minimum reflection (i.e. low S11, S22 parameters).)

On a MMIC, microstrip transmission lines readily match higher impedances than 50 ohms at low power levels but matching lower impedances at high power levels requires care in design to maintain efficient MMIC compactness. When higher power levels are being considered, RF current levels on the order of an ampere appear, and the requirement placed on the transmission line is to match such lower impedances. For instance, when the active power devices are high frequency transistors, whose operating voltage is on the order of 10 volts, the "generator" impedances are on the order of an ohm. The narrow width printed circuit runs required for compactness of MMIC designs makes the attainment of circuit runs at one ohm impedance levels awkward, and they must be used sparingly if at all. Furthermore, efficient power matching through this range of impedance levels is difficult and impractical except for narrow band operation.

On the other hand, transistors operating at GHZ frequencies have problems of their own for high power operation The efficient distribution of RF energy through the devices becomes difficult as the power level/current level increases, and the lengths of the fingers defining the active region increase. It becomes evident that operation of several devices in parallel may be required as opposed to operation of one large device. In addition, optimization within the device of the manifolding structure (by means of which internal parallelization is achieved), may also be required.

From the above considerations, it is clear that achieving high power-high bandwidth operation of MMIC power amplifiers requires care in selection of the topology and electrical design of the active power devices as well as care in selection of the topology and electrical design of the accompanying circuitry. The present invention is addressed to achieving high power by careful selection in respect to both the active device employed and the passive circuitry by means of which they are connected together and to the external world.

A major application of MMICs is in conjunction with solid state radar systems in which, in current designs, a single solid state power stage drives a single element of the array. The problem posed for the solid state design is in achieving the high power levels that prior designs have achieved and in addition, achieving wide band operation at these high power levels. The requirements of high power and high bandwidth conflict, and while narrow band designs have achieved quite high power levels, wide band designs have not.

SUMMARY OF THE INVENTION

Accordingly it is an object of the invention to provide an improved MMIC power amplifier.

It is a further object to provide a MMIC power amplifier having increased power and bandwidth.

It is still another object to provide a high power, wide band MMIC power amplifier, which is of a conservative easily reproduced design.

These and other objects of the invention are achieved in a novel power amplifier for operation over an octave band of frequencies above 1 GHZ and at power levels in tens of watts. The amplifier is designed to accept input signals at 50 ohms impedance over the operating band with a minimum return loss (S11), and to deliver output signals to a 50 ohm load over the operating band with a minimum return loss (S22).

The power amplifier is formed on two substrates, the driver transistor, input network, power transistor and interstage network being formed on a gallium arsenide substrate, while the output network is formed on a barium titanate substrate having a high dielectric constant (i.e. 37).

The driver and power transistors have a common topology, the driver transistor having two cells of given size and the power transistor having four cells of double given size, the clustering and scaling optimizing the desired high frequency-high bandwidth performance.

In respect to transistor topology, each cell has a rectangular configuration with interdigitated source, drain, and gate segments, a gate segment manifold being placed to one side of each cell, a drain segment manifold being placed to the other side, and a source segment manifold, formed of a linear air bridge spanning each cell to contact the centers of each finger, making ground contact at the top and bottom of each cell. The cellular topology provides improved device efficiency and provides an input impedance in the driver and power transistor cells above the minimum required to facilitate an efficient broad band match using the disclosed input and interstage networks and facilitates reasonable signal gain. Since the transistors operate at high power levels, they exhibit a significant fall off in gain over the octave band due to significant input capacitance.

The disclosed input network, which achieves these several tasks, has four serial sections each contributing to a downward, low loss impedance transformation, and each exhibiting resonance with staggered tuning, at or above the upper edge of the band, and excess inductance to compensate for input capacitance and to offset the fall-off of transistor gain over the octave band.

The interstage network also has four serial sections, each contributing to a reduction in impedance levels and each contributing to equalizing the frequency response over the octave band. The interstage network operates at higher current levels than the input network but accommodates a lower range of impedances.

The output network has been placed on a separate substrate having a high dielectric constant (i.e. 37) in order to allow formation of four transmission lines with appropriate impedances, low losses and compatible dimensions to couple power from the four paralleled power cells of the power transistor. The output network is then fanned in twice to couple the signal to a single path leading to the 50 ohm output terminal.

The networks each provide means to avoid push-pull moding in the paralleled cells, and two section filters for the biasing means are provided to avoid below band and in band frequency instability. The bias filters also enter into shaping of the response by contributing inductances where needed to shape the overall response of the signal paths.

These measures act in necessary combination to achieve a significant advance in high power-high band width microwave power amplifier performance.

DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

FIG. 1A showing the active and passive circuitry formed on a flat gallium arsenide substrate and FIG. 1B showing a passive output network at a reduced scale, formed on a second high dielectric constant, barium titanate substrate;

FIG. 5A being an equivalent circuit representation of the input network illustrating the four serially connected filter sections in the signal paths; FIG. 5B being a graph of the return loss (S11) versus frequency and FIG. 5C being a graph of the insertion loss (S21) versus frequency;

FIGS. 6A and 6B being respectively a first and a second derived equivalent circuit representation of the upper half of the interstage network coupling one driver transistor cell to the upper two cells of the power transistor and illustrating the four serially connected filter sections in the signal paths; and FIG. 6C is a graph of the insertion loss (S21) versus frequency of the interstage network; FIG. 7A being an equivalent circuit representation of the output network illustrating the four serially connected filter sections in the signal paths, and FIG. 7B being a graph of the insertion loss (S21) versus frequency of the output network.

DESCRIPTION OF THE PREFERRED EMBODIMENT

Figure 1A:
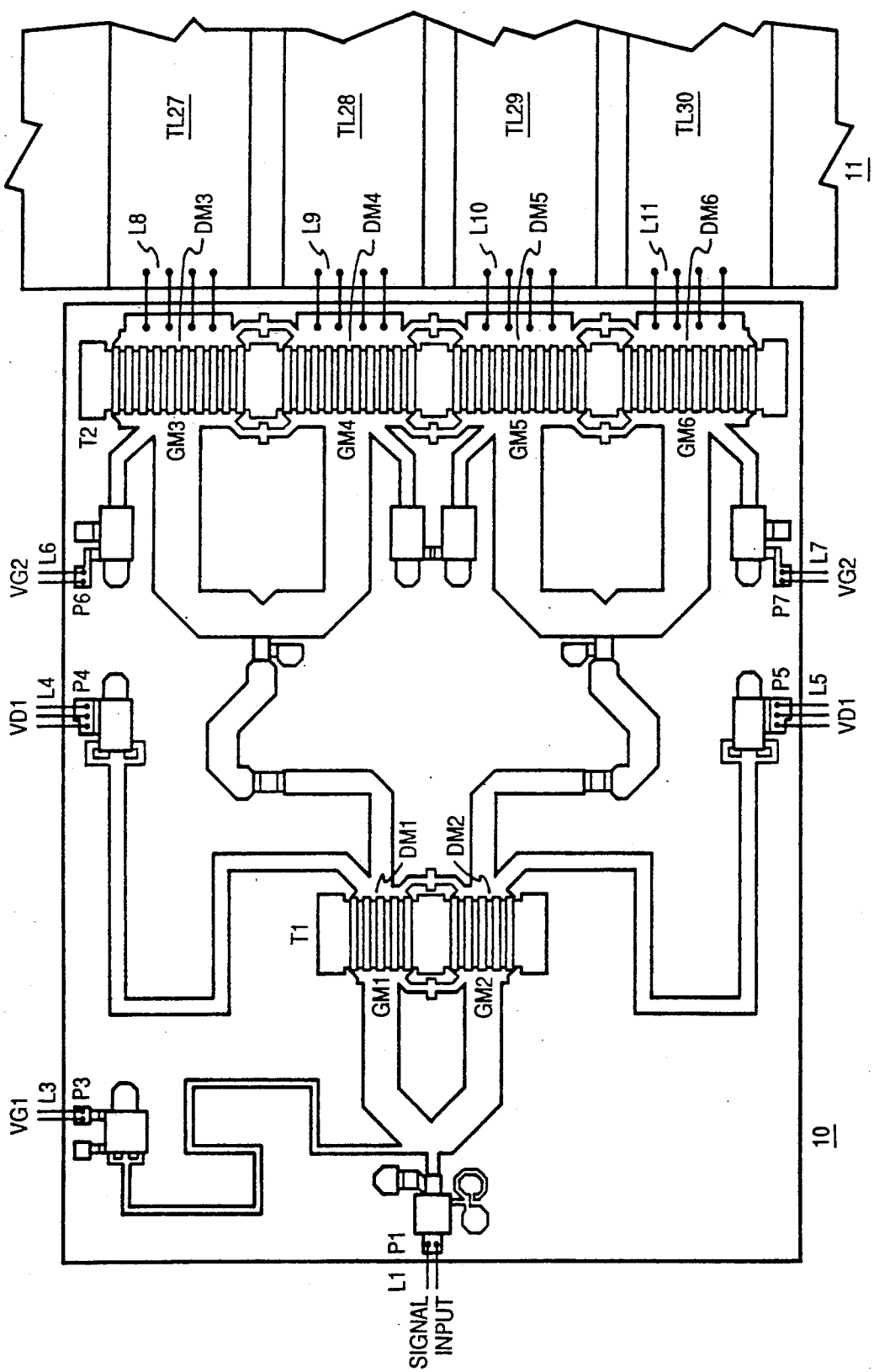
FIGS. 1A and 1B provide a plan view of a novel two stage MMIC power amplifier in accordance with the invention.
Figure 1B:
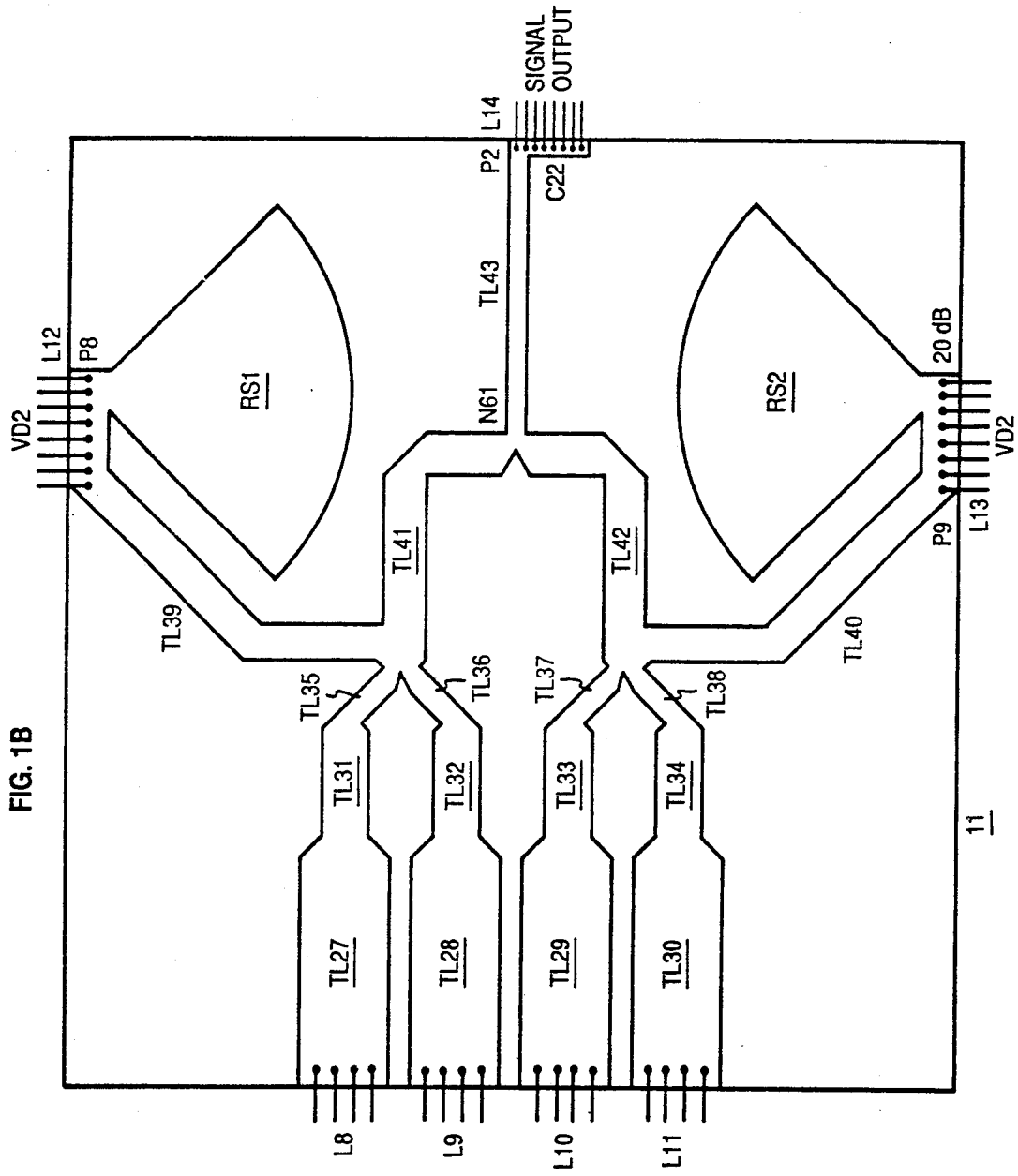

FIGS. 1A and 1B provide the layout of a novel two stage MMIC power amplifier operating over a band of three to six Gigahertz. The amplifier produces 11 Watts±1 DB from 3.0 to 6.0 GHZ, with maximum power outputs of 13.5 Watts and 10.5 Watts at the respective S (2.1-2.3) and C (5.2-5.9) radar bands, and a minimum power of 9 Watts (at 5.0 GHZ in the 3-6 GHZ range). The physical realization is a two-stage MMIC with 40 mm of gate periphery for the two field effect transistors. The FETs are based upon 0.5 $\mu$m gate length selective implant MESFET technology. The MMIC design is readily reproduced with a high yield—currently Over 40%.

The power amplifier is formed on two substrates 10 and 11. The two substrates are in turn assembled upon a molybdenum carrier, providing good thermal conductivity and having a thermal coefficient of expansion matched to the substrates. The attachment is by means of a AuSn eutectic bond. Depending upon application, other carriers may be employed.

The active and much of the passive circuitry of the power amplifier including the driver transistor T1, and the power transistor T2, and an input network and an interstage network are formed on the substrate 10. The substrate 10 is of a monocrystalline material, such as gallium arsenide, suitable for the formation of active semiconducting devices operating at the cited frequencies. The output network, which includes no active elements, is formed on the substrate 11. The substrate 11 of a material having a high dielectric constant, (e.g. approximately 37), such as barium titanate, facilitating robust current paths between the power transistor and the signal output terminal. The function of the input, interstage, and output networks is to efficiently couple a broad band low level signal of 3-6 GHZ derived from a 50 ohm line, successively to the low impedance driver transistor, to the lower impedance power transistor, and to couple the high power level output signal to the 50 ohm signal output terminal.

The input terminal for connecting the power amplifier to a 50 ohm (resistive) low level RF signal source is provided at pad P1 on the substrate 10. The output terminal for connecting the amplified RF to a 50 ohm (resistive) load is provided at the pad P2 on the substrate 11. Both input and output signal connections use wirebonds, as illustrated. At an intermediate point in the signal path where the power transistor T2 on the gallium arsenide substrate 10 is coupled to the input of the output network on the barium titanate substrate 11, four sets of wirebonds (L8, L9, L10, L11) are provided, as illustrated.

The power connections to the power amplifier are also provided by flying leads bonded to pads on the periphery of the two substrates. The gate potential (VG1) for the two cells of the driver transistor is supplied to the pad P3 on the upper edge of substrate 10. The drain potential (VD1) for the two driver transistor cells is supplied to the two pads P4 and P5, at the upper and lower edges of the substrate 10 respectively. The gate potential (VG2) for the four cells of the power transistor T2 is supplied to the pads P6 and P7 at the upper and lower edges of the substrate 10 respectively. The drain potential (VD2) for the four cells of the power transistor T2 are supplied to the pads P7 and P8 at the upper and lower edges of the substrate 11 respectively. The gate potentials VG1 and VG2 are typically $-1$ volt, and the drain potentials VD1 and VD2 are typically $+8$ to $+9.5$ volts.

The driver transistor T1 and the power transistor T2 are MESFET transistors (i.e. metal semiconductor field effect transistors) based on a commercial 0.5 micron gate length with peripheries of several millimeters. Each of the cells (TC1, TC2) of the driver transistor T1 have a four millimeter periphery while each of the cells (TC3, TC4, TC5, TC6) of the power transistor T2 have an eight millimeter periphery.

Figure 2:
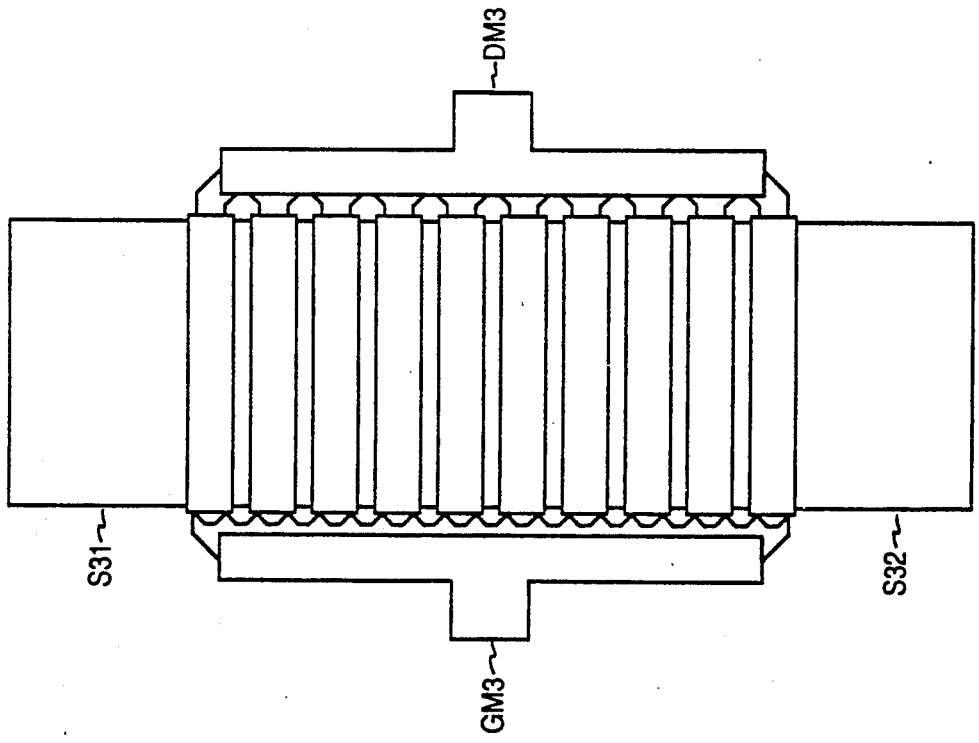
FIG. 2 is a layout of a cell of a MESFET power transistor, the active element in the output stage of the power amplifier.

The horizontal topology of the cell is shown in FIG. 2. The gate regions are disposed interdigitally. In the case of the driver transistor, there are ten gate regions, each 400 micron long and in the case of the power transistor T2, there are twenty gate regions, each 400 micron long in a rectangular arrangement.

The gate manifold of the cell TC3, illustrated in FIG. 2 at GM3, to the left of the cell, is connected to the left ends of the gate fingers while the drain manifold at DM3 to the right of the cell is connected to the right ends of the drain fingers. The source manifold is a plated gold air bridge SM3 which is connected to the middle of each source finger crossing beneath it. The air bridge extends between the pads S31 and S32 at the top and bottom of the cells. The pads 31 and 32 connect the source manifold to ground by means of vias, not illustrated, under each pad passing through the substrate to the substrate ground.

The illustrated horizontal topology of the transistors T1 and T2 is a result of the delicate trade-off between thermal, manifold phasing, gate attenuation, and power density considerations. The designs of these devices are somewhat unusual for microwave power GaAs FETs. Generally, when multiple millimeters of periphery are required to reach a requisite power level, several cells with individual gate, drain, and source connections are processed together on a single die. In the amplifier design herein described, single-cell devices having 4 and 8 millimeter peripheries have been successfully applied in an octave band (3-6 GHZ) high power (10 Watt) amplifier. The devices, which employ a plated gold air bridge source interconnect system are fabricated on low pressure LEC (liquid encapsulated Czochralski) substrates using ion implantation and a Ti/Pt/Au plated-gate metallization system.

Several circuit parameters that are pre-requisites for successful multi-stage wideband power MMIC design, i.e., an adequate gate circuit gain-bandwidth product that supports octave band operation, and similarity in optimum power match and small signal gain match impedances, are achieved in this planar device. These parameters are important in that both small signal and power gain are limited quantities. Hence bandwidth cannot be increased with resistive techniques without degrading gain and load pull losses are intolerable from both a power output and efficiency viewpoint. The net result is that the critical compromise between small signal gain and large signal power match in the interstage networks is less severe with a device possessing the requisite characteristics, and these networks can be designed for a wider bandwidth.

Figure 3:
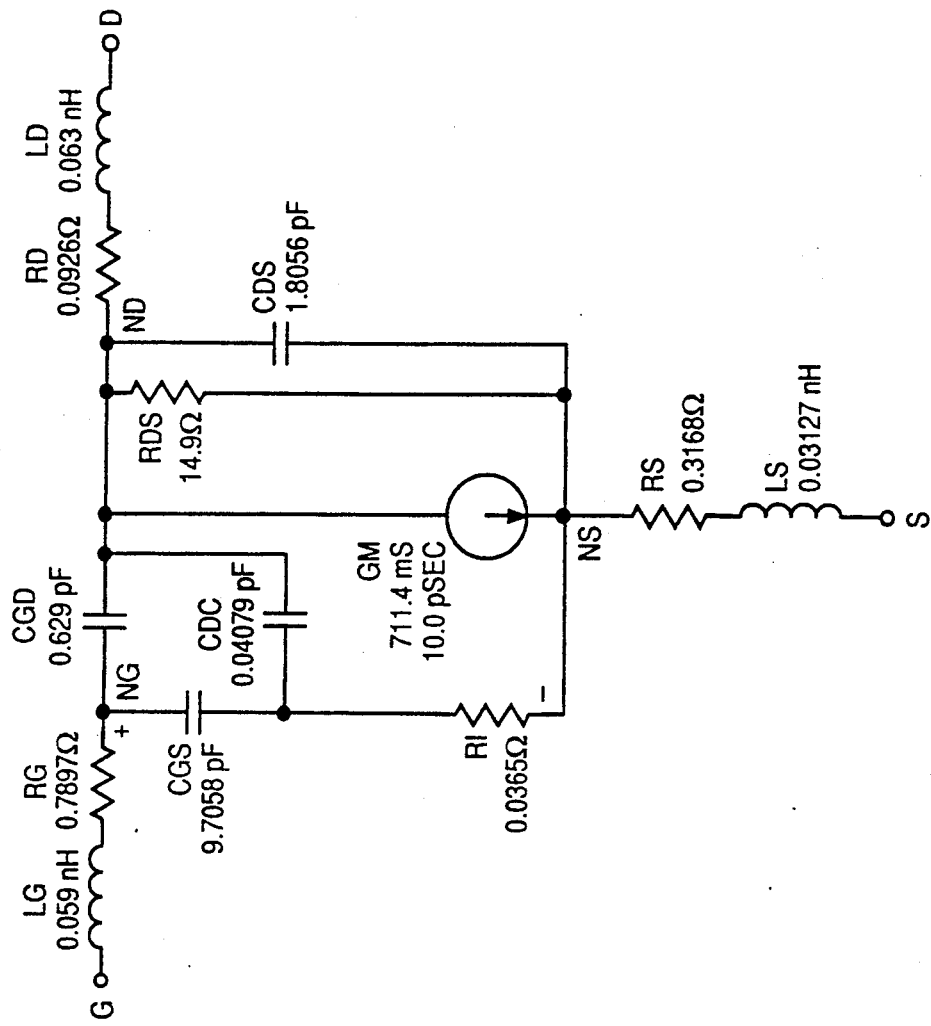
FIG. 3 is an equivalent circuit or model for small signal operation of a cell of the power or driver transistor with the circuit values for the power transistor cell being indicated.

The small signal model of the cells is illustrated in FIG. 3. The values provided in the FIGURES are for the larger (8 mm) cell of the power transistor. The model assumes a VDS voltage of 9 volts and an IDS current of 1.3 amperes. The model is a three terminal representation in which the gate, drain and source are the external terminals. As illustrated, a series inductance and series resistance are present in the path from each external terminal to the three internal nodes NG; ND; and NS. A serially connected capacitor CGD couples node NG to ND. A capacitor CGS and resistance RI connect the node NG to the node NS while a capacitor CDC is connected between the junction of CGS and RI and the node ND. The transconductance measured in milliSiemans (MS) providing the transistor gain mechanism, appears between the nodes ND and NS, shunted by the resistance RDS and the capacitance CDS.

The small signal model is coupled and its complexity provides an indication of the problem posed for the external networks in achieving a broad band amplifier design. In addition, the model looses accuracy at high power levels.

The design of the present power amplifier is based upon a comprehensive device characterization which includes both linear/non-linear modeling and test measurements. De-embedded small signal S-parameters of the MESFET are measured and equivalent circuit models are fitted to the data. The model of FIG. 3, is utilized as a starting point for linear analysis and optimization. Measurement of I/V characteristics, augmented with optimum load/contour data obtained via load pull are used to derive a consistent linear/non-linear computer based model which is used for non-linear analysis using harmonic balance.

The equivalent electrical properties of the cells, and the physical dimensions of the manifolds to which network connections are made, given that the amplifier is to produce ten watts over a three to six Gigahertz band, dictate to a substantial degree the electrical and physical properties of the input, interstage and output networks. One immediate consequence of the model, readily confirmed by test, is that the cells of the transistors T1 and T2 will exhibit a 12 DB decrease in gain over the three to six Gigahertz band. The decrease in transistor gain is equalized by the input and interstage networks. These and other issues in the design will be treated in what follows.

The amplifier presents to the signal source connected to pad P1 and having a characteristic impedance of 50 ohms, a closely matched load. The gate impedance of the two cells of the driver transistor T1 which is of an impedance much lower than 50 ohms, forms the ultimate load to the signal source. The input network provides the necessary impedance transformation to cause the match. The gate impedance, derivable from the model illustrated in FIG. 3, is a few ohms resistive combined with an approximately equal shunt capacitive reactance at the operating frequencies (i.e. each gate impedance is approximately 5 ohms resistance). The impedance from pad P1 to the gate of one driver cell thus falls by a factor of approximately 10 to 1—or approximately 20-1 taking into account that the two gates, connected in parallel, form the ultimate load. The input network provides the required match between signal source and the gates of the driver transistor over the octave band and it also has a transfer characteristic rising with frequency in the amount needed to offset the loss of gain of the driver transistor over the same octave band.

The match of the two cells of the driver transistor T1 to the signal source is accomplished, in accordance with the invention, by means of a four section input network using only reactive components in the signal paths to avoid losses. Each section contributes to matching the smaller output impedance and each section contributes to a positive slope in the network's frequency response.

The generator impedances at the drain manifolds of the driver transistor T1 are approximately 15 ohms resistive with a relatively small capacitive component while the load impedances at the gate manifolds of the power transistor T2 are a few ohms (e.g. 2.5 ohms) resistive with a comparable capacitive reactance. The resistive component of the impedance thus should fall by a factor of approximately 7.5 to 1. Taking into account that two gate manifolds are in parallel, the ultimate impedance transformation should be doubled. The interstage network is thus required to match the two driver cells to the four power cells over the octave band and to equalize the fall-off in gain of the power cells across the band.

The interstage match is accomplished by means of a second four section interstage network using only reactive components in the signal paths to avoid losses. In the design, each section contributes to matching successively smaller output impedances and each section contributes to a positive slope in the network's frequency response.

The generator impedances at the drain manifolds of the power transistor T2 are 7.5 ohms resistive with a relatively small capacitive component while the power amplifier is required to match a 50 ohm resistive at the signal output pad P2. The impedance rises by a factor of approximately 7.5 to one and the output network fans in two times, to effectively quadruple the matching ratio. While the input and interstage networks have been designed to off-set the fall off in transistor gain across the octave band, the output network assumes that a flat frequency response has been achieved, and provides an essentially flat frequency response across the band.

The output network accomplishes the impedance match by means of a third four section output network using only reactive components. In fact only transmission line elements, which are of lower loss than lumped elements are used in the signal paths. Each section contributes to an improved impedance transformation, in order to match an output impedance which is larger than the "generator" impedance.

While the foregoing input, interstage, and output networks have been characterized in terms of their ability to transfer the signal between their respective inputs and outputs, the networks must also provide the means for introducing bias voltages to the gates and drains of the six transistor cells and the means to prevent instability between the cells when operated in parallel. These means are illustrated in FIGS. 4A and 4B.

Figure 4A:
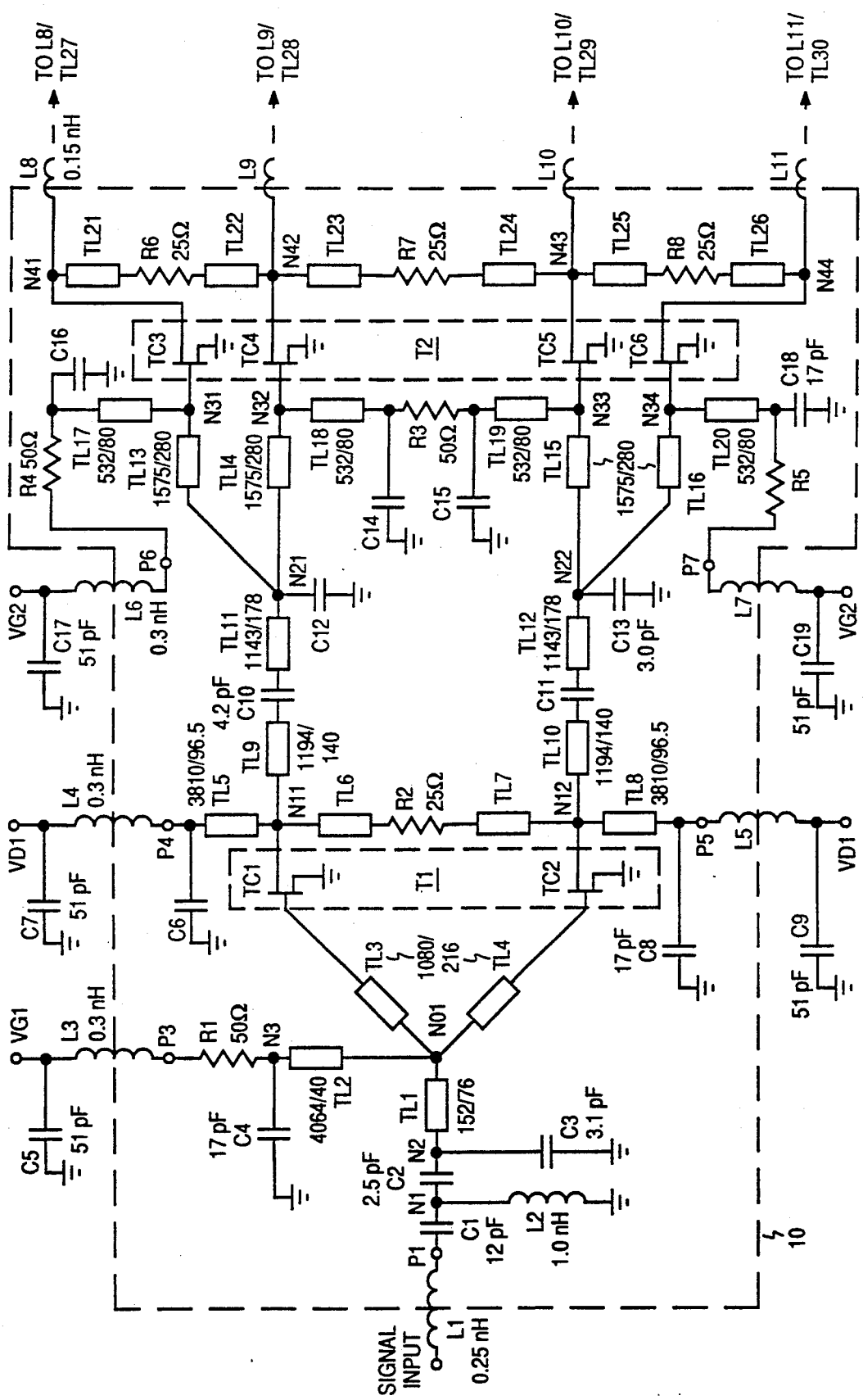
FIGS. 4A and 4B form an electrical circuit representation of the power amplifier, with FIG. 4A illustrating the active and passive circuitry on and connected to the gallium arsenide substrate and FIG. 4B illustrating the passive circuitry of the output network on and connected to the barium titanate substrate.
Figure 4B:
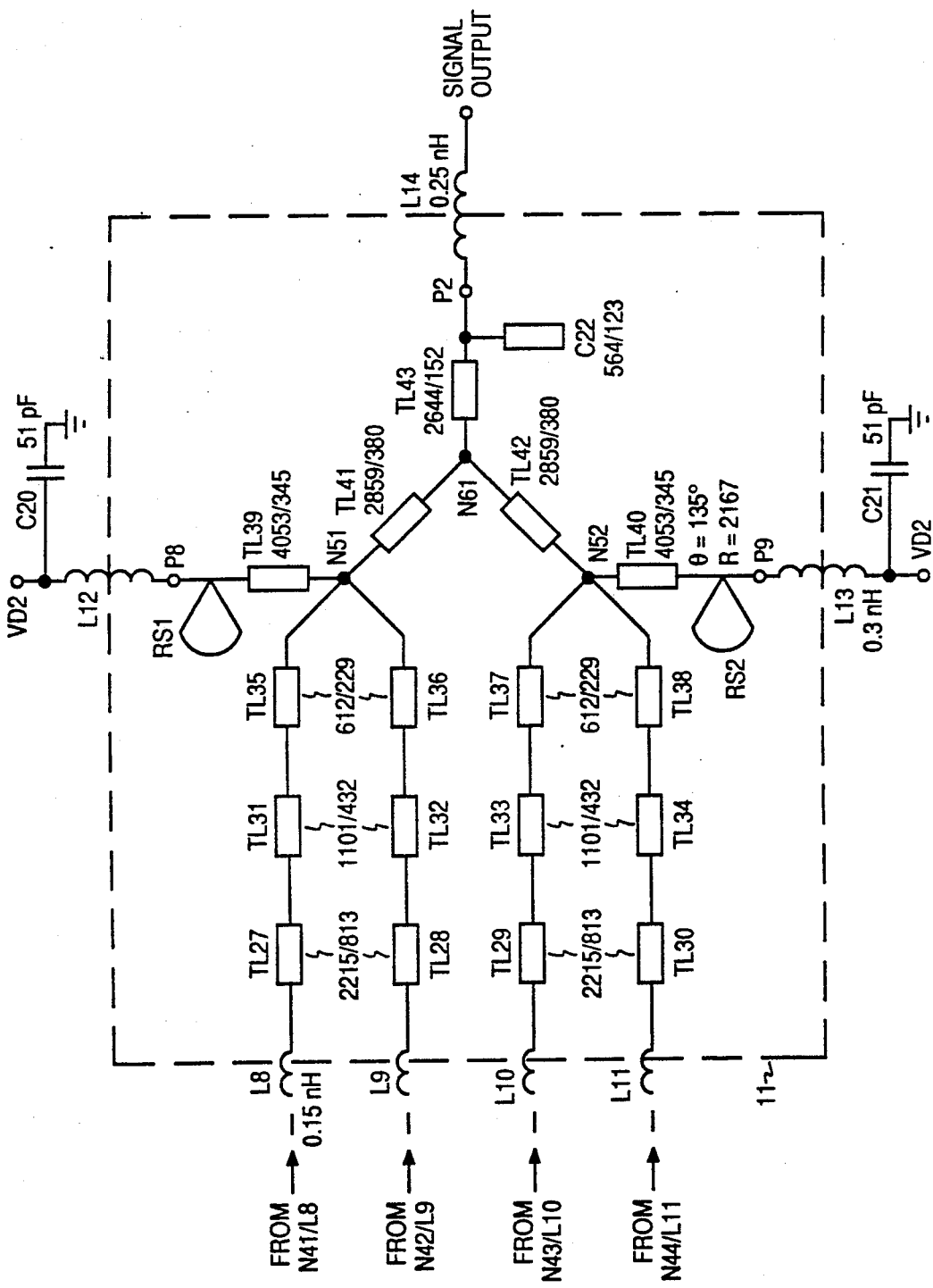

The input network, which couples signals from the signal input pad P1 to the two gate manifolds of driver transistor T1 and which provides filtering for the gate bias, is illustrated in FIG. 4A. FIG. 4A shows the circuit elements and the connections between elements. An equivalent circuit representation of the input network useful in understanding the operation of the input network is provided in FIG. 5A. The frequency response of the input network is provided in FIG. 5B which shows the return loss (S11) and FIG. 5C which shows the insertion loss (S21).

In FIG. 4A, the circuit elements are depicted in a spacial layout approximately corresponding to their physical disposition on the gallium arsenide substrate. (The substrate is of a single rectangular outline, as illustrated in FIG. 1A and not stepped in as illustrated in FIG. 4A.) The circuit is formed in what is termed an "MMIC" format in which both active and passive circuit elements are formed on the substrate. The substrate is 5 mils in thickness with a metallic conductive layer on the under surface forming a ground plane. The upper surface of the substrate, which is of high resistivity except where doped, supports patterned metallizations used to form the passive electrical components and point-to-point conductive connections. At the frequencies involved, conductors are likely to exhibit inductive and conductive reactances.

The passive components are formed on the surface of the substrate insulated from each other and from the ground plane except where conductive paths on the surface of the substrate are provided or "vias" through the substrate are provided. The inductors are formed of long and narrow conductor runs, usually not spiraled. The larger capacitors are formed of two overlapping metallizations—usually short and wide, one formed on the substrate surface, and the second upon a dielectric layer formed over the first metallization. The passive components are grounded as necessary by "vias". Microstrip transmission lines are formed by rectangular metallizations of controlled length and breadth, with the substrate ground plane providing the ground plane and the surface metallization providing the strip conductor. The characteristic impedance of the transmission line is set by adjusting the breadth of the surface conductor and the reactance of the transmission line is set by adjusting the length of the surface conductor in relation to the operating wavelength. Thus a transmission line may be dimensioned to provide a small inductive or a small capacitive reactance, or it may be dimensioned to act as a resonant LC circuit. Gallium arsenide, which has a high dielectric constant (e.g. approximately 13), provides compatible geometry in a 5 mil thickness to allow the transmission lines to be sufficiently wide to avoid significant $I^2R$ losses in the signal paths and a width compatible with efficient connection to the gate and drain manifolds of the transistor cells.

As shown in FIG. 4A, the input network comprises three inductors L1, L2, and L3; five capacitors C1, C2, C3, C4, and C5; one resistor R1 and four transmission line sections TL1, TL2, TL3, and TL4.

The circuit elements of the input network are interconnected as follows. The signal input terminal is connected via series connected inductor L1 and capacitor C1 to the node N1. The inductor L1 is the wire bond or double flying lead, differently represented in FIGS. 1A and 4A. The wire bond connects the signal input terminal to the pad P1. The self inductance (0.25 nH) of the wire bond forms the serial inductance in the first section of the input filter. The inductor L2 is connected between node N1 and ground, and the capacitor C2 is connected between node N1 and N2. The capacitor C3 is connected between node N2 and ground and the short (152 long by 76 micron wide) transmission line TL1 is connected between node N2 and node N01, from which the three transmission lines TL2, TL3, and TL4 branch. The other end of the transmission line TL3 is connected to the gate manifold of driver transistor cell TC1; and the other end of the transmission line TL4 is connected to the gate manifold of the driver transistor cell TC2. The other end of the transmission line TL2 is connected to the node N3, which is bypassed to ground by the capacitor C4. The resistor R1 is connected between node N3 and the pad P3 and the inductor L3 is connected between pad P3 and the terminal VG1 for application of gate bias potentials. The capacitor C5 is connected between the terminal VG1 and ground. The inductor L3 is a wire bond pictured in FIG. 1A, which connects pad P3 to the terminal VG1, and which has the self inductance (0.3 nH) marked in FIG. 4A.

The driver gate bias filter, which utilizes the elements TL2, C4, R1, L3 and C5, is a two section low pass filter with the lower section (TL2 and C17) attenuating signals at operating frequencies and the upper section (R1, L3, C5) attenuating signals far below the pass band. The elements R1, L3 and C5 reduce the power gain and stabilize the driver transistor at low frequencies where the transistor gain is very high. The gate resistor R1 also protects the driver transistor cells TC1 and TC2 from burnout due to excess forward or reverse gate current by providing a voltage drop that centers the RF voltage swing within the safe operating area of the device I/V characteristic.

The transmission line TL2, which is approximately one one-quarter wave in electrical length, in combination with the shunt capacitor C4 creates a shunt inductance between the node N01 and ground, which enters into the signal response of the input network, forming a shunt element shared between the third and fourth sections of the network.

The circuit values of the elements making up the input network are marked upon the drawings. The transmission line sections are marked with the length proceeding the width in micron dimensions. The dimensions are appropriate for a gallium arsenide substrate having a thickness of 5 mils. Since the characteristic impedance of the transmission line falls as the breadth of the transmission line increases, the transmission line width is increased from transmission line TL1 (e.g. 76 microns) originating at node N2 to transmission lines TL3 and TL4 (e.g. 216 microns) which are connected to the gate manifolds of the driver transistor. The transmission line TL2, not in the signal path, however, is narrow (e.g. 40 microns) and retains a high characteristic impedance and appears as a large shunt inductance.

Figure 5A:
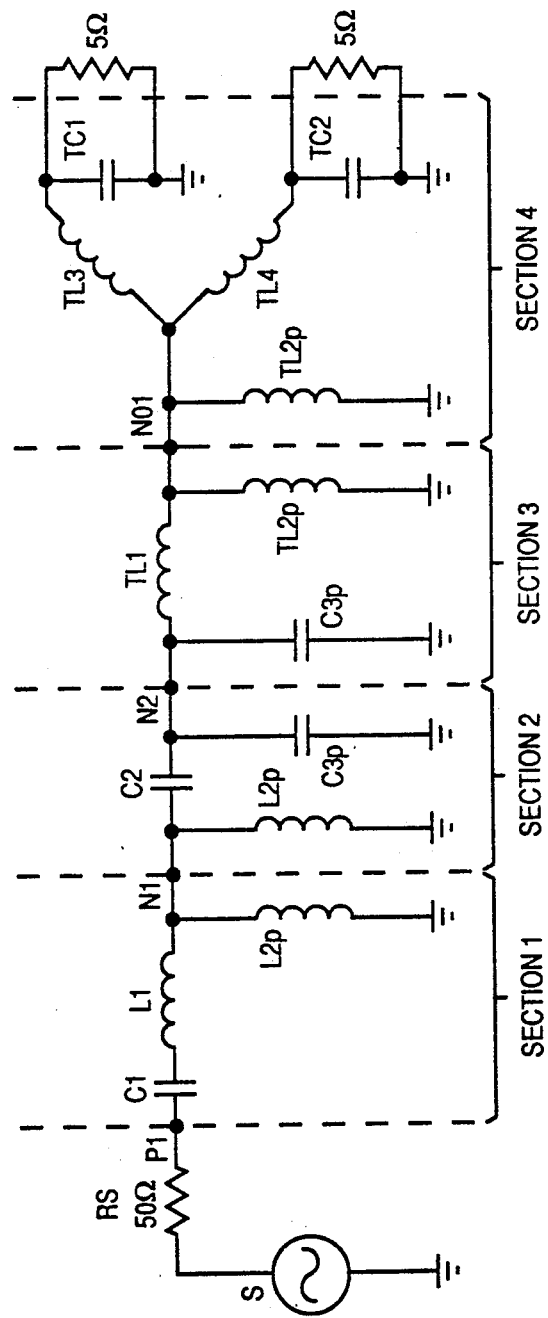
FIGS. 5A, 5B and 5C pertain to the input network which couples signals from a 50 ohm input to the two cells of the driver transistor.

FIG. 5A is an equivalent circuit representation of the input network. The equivalent circuit representation indicates the formation of four filter sections from the circuit elements shown in FIGS. 4A and 4B. Each filter section provides an impedance transformation downward and each contributes to an upward sloping frequency response over the three to six Gigahertz operating band of the amplifier.

The reference numerals applied to the circuit elements of FIG. 5A correspond to those in FIG. 4A, with the exception that the shunt components L2, C3, and TL2 are represented respectively by two parallel inductances (L2P, L2P), two parallel capacitances (C3P, C3P), and two parallel transmission lines (TL2P, TL2P) split between adjoining filter sections. In addition, the serial order of L1 and C1 have been interchanged.

While numerical solutions more accurately describe the operation of the network, it may be seen that each section permits a downward impedance transformation, provided proper values for the impedances have been selected. The transformation occurs without the use of dissipative elements. In the first section the impedance is transformed downward by an inductive voltage divider (L1 and L2P); in the second section by a capacitive voltage divider (C2 and C3P); in the third section by a transmission line voltage divider (L of TL1 and the L of TL2P) and in the fourth section by a combined transmission line (L of TL3) and capacitive (TC1) voltage divider. The successive downward impedance transformations are designed to match the 50 ohm resistive source impedance to the approximately 5 ohm resistive component at the two gate manifolds of the driver transistors T1.

The frequency response of the network is proportioned to create a generally upward increase in signal transmission (S21) from the lower to the upper limit of the band. The first filter section has a series LC circuit which is tuned to resonate near the upper band limit. The second and third filter section each contain a parallel resonant LC circuit, which is also tuned to resonate near the upper band limit. The final section contains a shunt connected series LC circuit in which the gate capacitance is essentially neutralized also near the upper band limit.

Figure 5C:
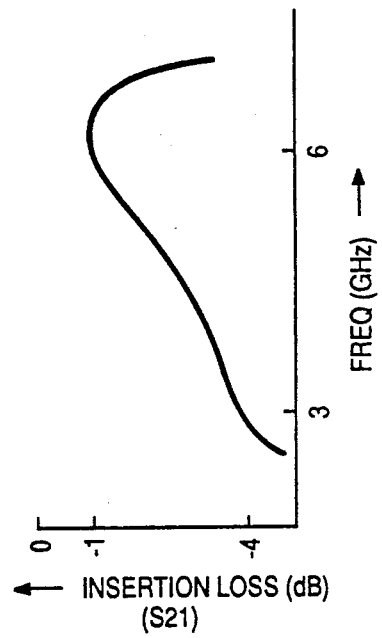
Figure 5B:
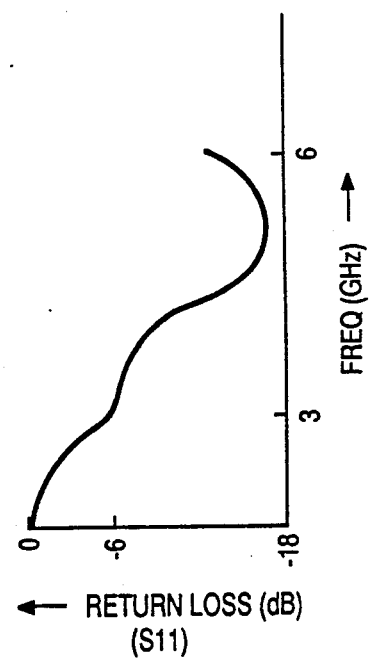

The performance of the input network is illustrated in FIGS. 5B and 5C. The return loss (S11) is between −6 and −17 DB over the octave band, and the insertion loss rises from −4 DB to −1 DB making the gain of the input stage substantially flat with frequency.

The interstage network, illustrated in FIG. 4A, couples signals from the two drain manifolds of driver transistor T1 to the four gate manifolds of the power transistor T2. The interstage network also provides filtering for the bias voltage supplied to the drain manifolds of transistor T1, filtering for the bias voltage supplied to the gate manifolds of the power transistor T2 and the necessary interconnections between the drain manifolds of transistor T1 to prevent push-pull instability. Also to insure a like frequency response between the four cells of the power transistor, a circuit (TL18, TL19, C14, C15, R3) is connected between gate manifolds of cells TC4, TC5 of transistor T2 to match the effect on the signal response of the gate bias filters connected to the cells TC3 and TC6 of transistor T2.

As shown in FIG. 4A, the interstage network comprises inductors L4, L5, L6, and L7; capacitors C6-C19; resistors R2, R3, R4, and R5; and transmission lines TL5-TL20.

The interstage network has two generally symmetrical halves which are interconnected by two shared resistors (R2 and R3). One half (the upper half in FIG. 4A) couples signals from the drain manifold of transistor cell TC1 to the gate manifolds of transistor cells TC3 and TC4 and the other half (lower half in FIG. 4A) couples signals from the drain manifold of transistor cell TC2 to the gate manifolds of transistor cells TC5 and TC6. The upper half provides a drain bias filter for driver transistor cell TC1, and a gate bias filter for the power transistor cells TC3 and TC4. The lower half provides a drain bias filter for the driver transistor cell TC2 and a gate bias filter for the power transistor cells TC5 and TC6. The two halves of the interstage network are interconnected at the drain manifolds of the driver transistor cells by the push-pull suppression circuit noted earlier, and at the gate manifolds of power transistor cells TC4 and TC5 are interconnected by the circuit for equalizing the frequency response between the four power transistor cells.

In the upper half of the interstage network, the drain manifold of the cell TC1, at node N11, is coupled via serially connected transmission line TL9, capacitor C10, and transmission line TL11 to the node N21 where branching occurs. The transmission line TL13 connects node N21 to the gate manifold of cell TC3 (at node N31) and a similar transmission line TL14 connects node N21 to the gate manifold of cell TC4 at node N32. In addition, a capacitor C12 is connected between the node N21 and ground.

Similarly, in the lower half of the interstage network, the drain manifold of the cell TC3, at node N12, is coupled via serially connected transmission line TL10, capacitor C11, and transmission line TL12 to the node N22 where branching occurs. The transmission line TL15 connects the node N22 to the gate manifold of cell TC5 at node N33 and a similar transmission line TL16 connects the node N22 to the gate manifold of cell TC6 at node N34. A capacitor C13 is connected between the node N22 and ground.

The drain bias filter for driver transistor cell TC1 is connected between the upper VD1 terminal and the drain manifold at node N11. It comprises the elements L4, C6, C7, and TL5. The element L4, a wire bond, connects the terminal VD1 to pad P4. The transmission line TL5 connects pad P4 to node N11. The capacitor C7 is a by-pass capacitor connected between upper VD1 terminal and ground, and capacitor C6 by-passes pad P4 to ground. The drain bias filter is a two section, purely reactive low pass filter. The elements L4 and C7 attenuate signals far below the pass band, and the elements TL5 and C6 attenuate signals at operating frequencies. The transmission line TL5 which is approximately one-quarter wave electrical length, in combination with shunt capacitor C6, provides a shunt inductance between node N11 and ground which enters into the signal response of the interstage network.

The drain bias filter for driver cell TC2 in the lower half of the interstage network, is connected between the lower VD1 terminal and the drain manifold at node N12 and it comprises the elements L5, C8, C9 and TL8. The two drain bias filters for the driver transistor are identical in design and function.

The gate bias filter for the power transistor cells TC3 and TC4 in the upper half of the interstage network is coupled between the upper VG2 terminal and node N31. It comprises elements L6, R4, C16, C17 and TL17. The element L6 is the bond wire connected between terminal VG2 and pad P6. The elements L6, R4, and TL17 are serially connected in the order recited between terminal VG2 and node N31, with the capacitor C17 by-passing the upper VG2 terminal to ground and the capacitor C16 by-passing the interconnection of R4 and TL17 to ground.

The gate bias filter is thus a two section low pass filter, with the upper section (R4, L6, C17) attenuating signals far below the pass band, and the lower section (TL17 and C16) attenuating signals at operating frequencies. The elements R4, L6 and C17 reduce the power gain and stabilize the power transistor at low frequencies where the transistor gain is very high. The gate resistor R4 also protects the power transistor cells TC3 and TC4 from burnout and center the RF voltage swing. The transmission line TL17, which is very short (approximately 1/32 wave) in electrical length, in combination with the shunt capacitor C16 creates a shunt inductance between node N31 and ground which enter into the signal response of the interstage network.

The gate bias filter for the power transistor cells TC5 and TC6 in the lower half of the interstage network is coupled between the lower VG2 terminal and node N34. It comprises the elements R5, L7, C18, C19 and TL20. The two gate bias filters for the power transistor are identical in design and function.

The push-pull suppression circuit for the driver transistor T1 comprises the elements TL6, R2 and TL7 serially connected between the node N11 and N12 at the respective drain manifolds. The transmission lines TL6 and TL7 are short (much less than lamda/4) and of arbitrary electrical length, with an actual length convenient for interconnecting the drain manifolds. The resistance of R2 is selected to absorb energy in the push-pull mode to suppress that mode. Assuming ideal parallel operation between calls R1 and TC2, the push-pull suppression network has a negligible effect upon the response of the interstage network.

A second circuit is provided in the interstage network for maintaining the signal response at the gate manifolds of power transistor cells TC4 and TC5 matched to that at the gate manifolds of cells TC3 and TC6. The circuit consists of the elements R3, C14, C15, TL18 and TL19. The capacitors C14, C15 are bipass capacitors of like value (17 pF) to the capacitors C16 and C17; and the transmission lines TL18 and TL19 are of like design (532/80) to the transmission lines TL17 and TL20. The resistor R3 absorbs push-pull energy at the gate manifolds while the transmission lines TL18 and TL19, which are very short in electrical length, in combination with shunt capacitors C14 and C15, respectively create shunt inductances between nodes N32 and N33 respectively and ground, which equalizes into the signal response at all four gate manifolds of the power transistor.

Figure 6A:
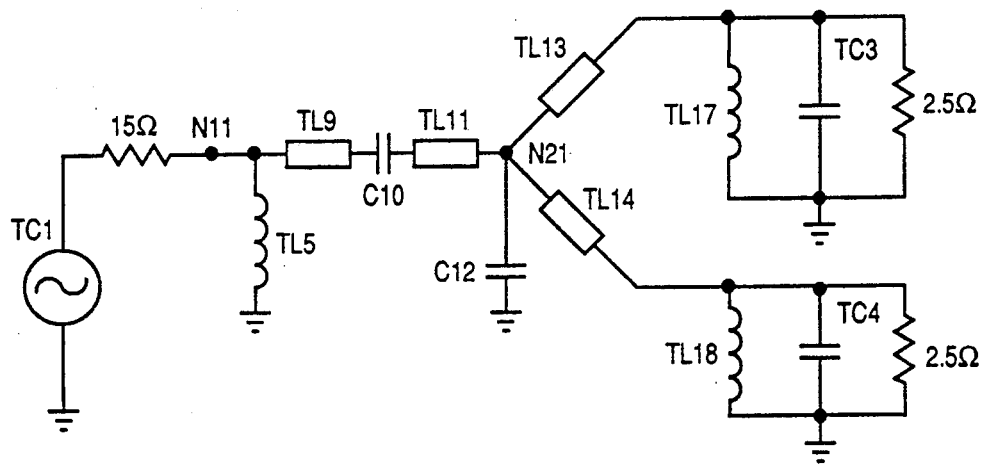
FIGS. 6A, 6B and 6C pertain to the interstage network which couples signals from the two cells of the driver transistor to the four cells of the power transistor.
Figure 6B:
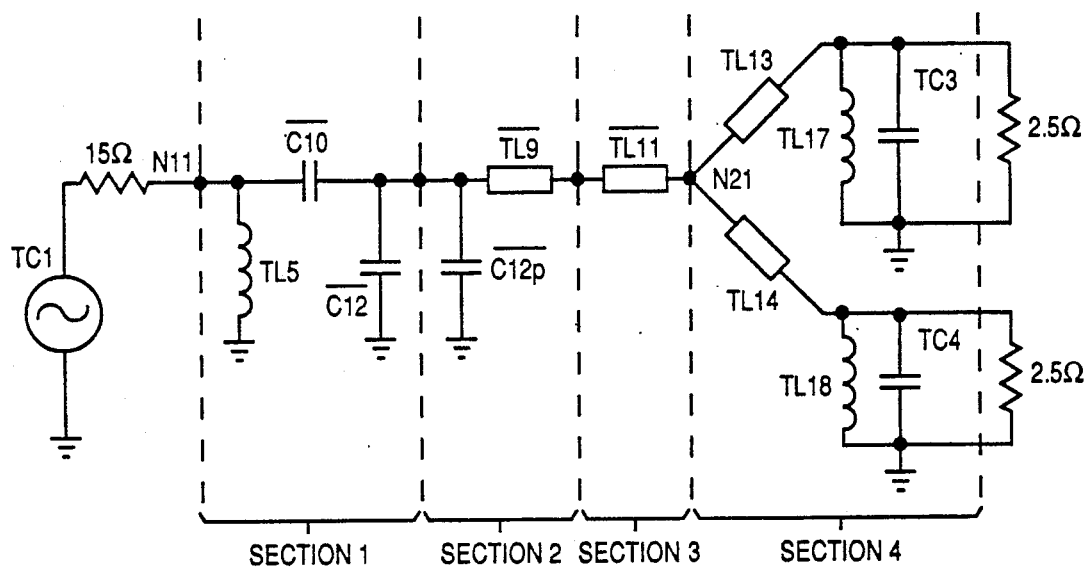
Figure 6C:
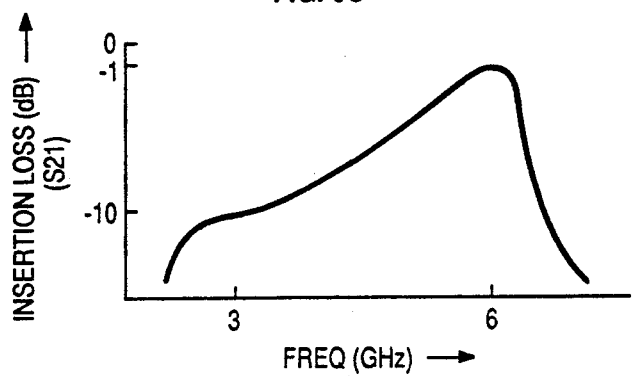

FIG. 6A is an equivalent circuit representation of the upper half of the interstage network which couples the driver transistor to the power transistor. FIG. 6B is a derived version of the equivalent circuit representation of FIG. 6A in which the shunt inductance provided by transmission line TL5, the series capacitor C10, and the shunt capacitor C12 are clustered into a single filter section, arranged to be the first.

As shown in FIG. 6B, the network is shown to start with a single signal path, commencing at the drain of transistor cell TC and branching at node N01 to form two signal paths leading to the gates of transistor cells TC3 and TC4. In passage through the interstage network, the signal encounters four sections. The first section is formed of the components TL5, C10 and C12.

The second and third sections are each formed of a transmission line (i.e. TL9 and TL11), and the last section, consists in each branch, of one serially connected transmission line (i.e. TL13 or TL14) and one shunt connected transmission line (i.e. TL17 or TL18). The serial transmission line lengths are very short (1/16the wave approximately) exhibiting an inductance with an increasing shunt capacitance or decreasing characteristic impedance.

As in the case of the input network, each filter section of the interstage network provides a downward impedance transformation required to match a 15 ohm output impedance at the drains of the driver cells to an increasing shunt capacitance and a virtual one-and-one-quarter ohm input impedance at the node N21 reflecting the 2½ ohm impedance at gates of the power cells (i.e. a downward transformation of 12). In addition to transforming the impedance, each filter section contributes to an upward sloping frequency response over the three to six Gigahertz operating band of the amplifier. As before, the frequency response is adjusted to flatten the frequency response of the stage by compensating for transistor gain which falls with increasing frequency.

The output network illustrated in FIGS. 4A and 4B couples signals from the four drain manifolds of the power transistor T2 to the signal output terminal P2. The output network also provides filtering for the bias voltage supplied to the drain manifolds of the power transistor and the necessary interconnections between the drains of the transistor cells to prevent push-pull instability. As earlier noted, the network is designed to provide an efficient match between the four output transistors which have an output impedance of approximately 7.5 ohms (substantially resistive) and a 50 ohm (resistive) load coupled to the signal output terminal. Thus, the network is required to match a load having an output impedance increased approximately seven times from four paralleled power transistors. Four virtual filter sections, using transmission line elements for maximum electrical efficiency in handling the large output currents, are employed to perform this task.

As shown in FIGS. 4A and 4B, the output network comprises inductors L8-L14, capacitors C20-C22, resistors R6-R8, transmission lines TL27-TL43, and two radial stubs RS1 and RS2.

As illustrated, the output network begins with four signal paths originating at the drain manifolds of the power transistor T2. These paths are twice consolidated into a single path leading to the signal output terminal. The drain manifold of the cell TC3 is connected via a wirebond consisting of four parallelled conductors to the transmission line TL27 on substrate 11. The wirebond is represented as an inductance L8 in FIG. 4A. The signal path from the drain manifold of cell TC3 proceeds through inductance L8, transmission lines TL27, TL31 and TL35 to the consolidation node N51. Similarly, the signal path from the drain manifold of cell TC4 proceeds via the wirebond L9, transmission lines TL28, TL32, and TL 36 to the consolidation node N51, where consolidation occurs between the signals from cells TC3 and TC4. Similarly, the drain manifolds of cell TC5 is serially connected via elements L10, TL29, TL33, and TL37 to the consolidation node N52 in one path and the drain manifold of cell TC6 is serially connected via the elements L11, TL30, TL34 and TL38 to the consolidation node N52. The signal path from the node N5 continues through transmission line TL41 to the node N61, and the signal path from node N51 continues through transmission line TL42 to the same node N61 where consolidation into a single path occurs. The node N61 is then connected via transmission line TL43 to the pad P2 which is connected by a low inductance wirebond represented by inductor L14 to the signal output terminal. A shunt connected capacitance C22 is connected to the pad P2.

The drain bias filter for the power cells TC3 and TC4 of transistor T2 is connected between the upper drain bias terminal VD2 and node N51. It comprises the wirebond represented by an inductor L12, and its elements C20, RS1, and TL39. The wirebond L12 and TL39 are serially connected between the upper bias terminal VD2 and node N51 with the capacitor C20 by passing the terminal VD2 to ground, and the element RS1, which is a radial stub RS1, being connected to the pad P8.

The drain bias filter for power cells TC3 and TC4 is also a two section low pass filter like the other bias filters, but in addition to having no resistive elements, it provides a broad band, band stop action to prevent passage of RF energy developed in power transistor cells TC3 and TC4 from entering the drain bias power supply. The first filter section, commencing at the upper bias terminal VD2 consisting of the elements L12, C20, attenuates signals at frequencies well below the operating band and is designed to prevent low frequency instability. The second section consists of the shunt connected radial stub RS1 and the serially connected quarter wave transmission line element TL39 leading to node N51 designed to attenuate signals lying within the broad band (3-6 GHZ) of operating frequencies. The broad band radial stub RS1 provides a low impedance to ground over the operating band and the quarter wave transmission line TL9 transforms the near short circuit presented by the stub RS1 to a high impedance at the node N51. The high impedance at operating frequencies precludes the entrance of signals at the operating frequencies into the filter.

The drain bias filter for the power cells TC5 and TC6 is connected between the lower drain bias terminal VD2 and node N52 and consists of the elements L13, C21, RS2, and TL40. The two drain bias filters of the output network are identical in design and function.

The push-pull suppression circuit of the output network comprises the elements TL21, R6, and TL22 serially connected between nodes N41 and N42; the elements TL23, R7, and TL24 serially connected between the nodes N42 and N43; and the elements TL25, R8, and TL26 serially connected between the nodes N43 and N44. The transmission lines TL21-TL26 are of like design, being much less than one-quarter wave electrical length and of arbitrary length. The resistances of R6, R7, and R8 are equal (25 ohms), and are selected to absorb energy in the push-pull mode to suppress that mode.

Figure 7A:
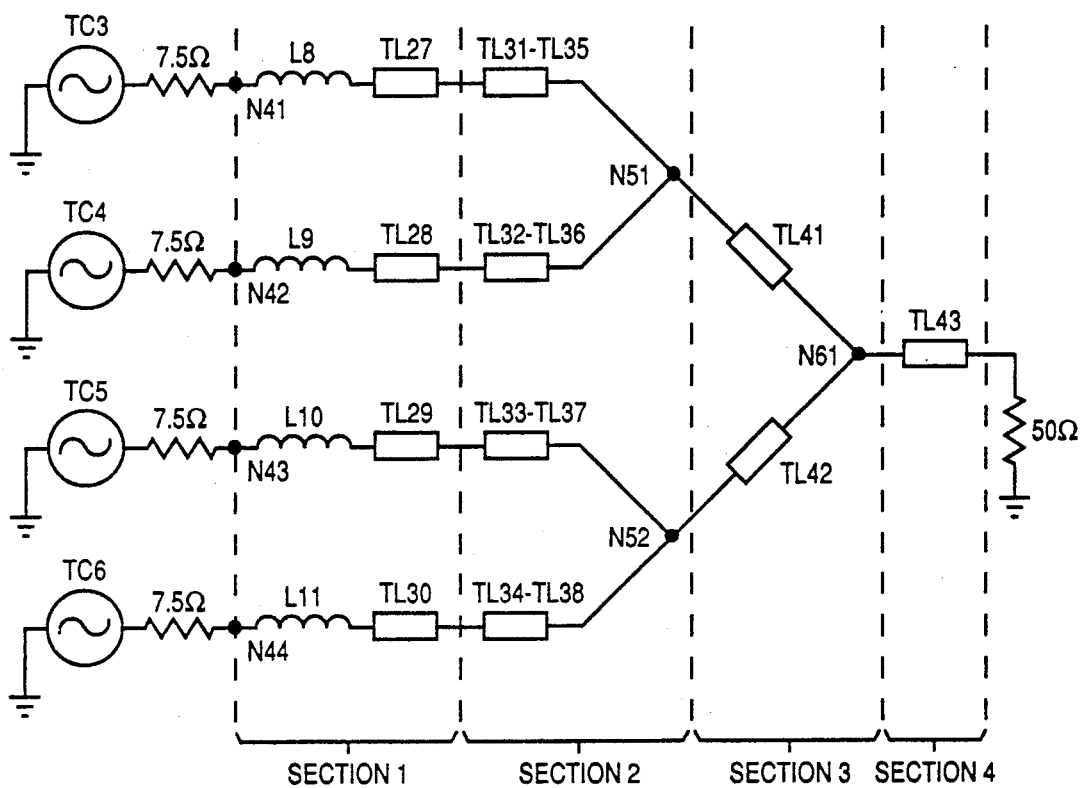
FIGS. 7A and 7B pertain to the output network which couples signals from the four cells of the output transistor to a 50 ohm output.

FIG. 7A is an equivalent circuit representation of the output network which is designed to have a flat frequency response and to provide a suggessive upward impedance transformation. The drain bias network and the push-pull suppression network have negligible effect upon the frequency response or impedance transformation of the output network, and are omitted from FIG. 7A.

FIG. 7A shows four equivalent generators, having internal resistances of 7.5 ohms, connected to each of the four nodes N41 to N44. The set of four wirebonds (illustrated in FIGS. 1A and 1B) connecting the nodes N41-N42 to the initial transmission lines (TL27-TL30), are each illustrated as a serial inductance in FIG. 7A. The principal elements in each path to the consolidating nodes N51, N52, however, are treated as being formed of two impedance transforming sections. The first section is constituted of a single transmission line (e.g. TL27) of 2,212 microns length by 813 microns dimension width. The second section, which follows, is constituted by a second transmission line (e.g. TL31) of 1,101 microns length by 432 microns width and a third transmission line (e.g. TL35) of 612 microns length by 229 microns width leading to the node N51. Thus the three transmission lines, which have lengths of respectively approximately 1/8th wave electrical length, 1/16th wave electrical length, and 1/32nd wave electrical length, form two sections of the network, each section providing a match to a progressively higher impedance and contributing to a broadband transmission characteristic.

At nodes N51 and N52 a pair of parallel transmission lines TL41 and TL42, forming the third section of the network lead to the final consolidation node N61. The transmission lines TL41 and TL42 are of approximately one-quarter wave electrical length (e.g. 3,859 microns in length and of a width (380 microns) to facilitate a match between the two lines feeding each of them, and a higher impedance at node N61.

The fourth section of the output network is formed of a fourth serial transmission line TL43 of 2,644 microns length by 152 microns in width, connected between node N6 and inductance L14 leading to the output pad P2. A virtual capacitance C22 formed of a small ungrounded metallization 564 microns in length by 123 microns in width is connected to the connection of TL43 to inductance L14.

Figure 7B:
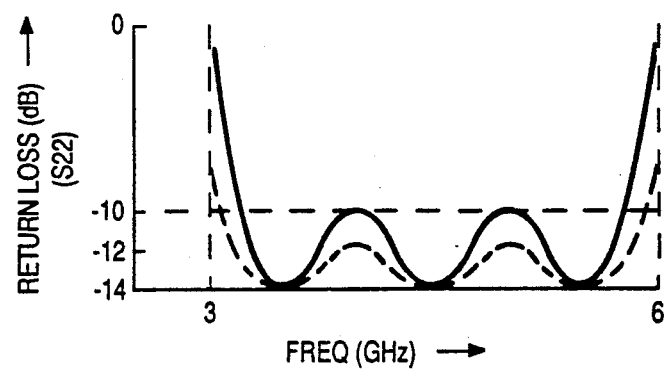

The output network represents a refinement of a more conventional matching network for achieving an upward electrical impedance transformation over a broad band. In the conventional arrangement, each of several sections would contain a transmission line of a quarter wave electrical length, with each transmission line having a characteristic impedance increased by a common factor over the preceeding transmission line. The output reflectance in the case of four section filters would have multiple ripples as illustrated in the solid line of FIG. 7B. The matching requirement between four generators each having an internal resistance of 7.5 ohms and driving a load of 50 ohms is increased twice by two consolidations of the signal paths to form the single output at node N61. This necessitates a larger impedance transformation than if a single source were involved requiring to a larger than two to one increase in impedance between successive sections. The illustrated arrangement, assuming successive transmission lines each of a quarter wave electrical length, would exhibit relatively high efficiency (good low S22 performance) over the portion of the band to which the lines were tuned—but not over an octave band. In the present design, however, staggered tuning is employed. The first filter section uses a transmission line which is slightly over 1/8 of a wave in electrical length and the second filter section uses two cascaded transmission lines which are respectively a 1/16th wave and over a 1/32nd wave, while the third section uses a transmission line under a quarter wave (as earlier noted). The fourth section is also under a quarter wave. The effect of the staggered tuning on achieving a broad band response is illustrated in the dashed line of FIG. 7B. Here rippling over the broad band is still produced, but the magnitude of the ripples is reduced and the average reflectance has fallen approximately 1 DB resulting in a significant improvement in power delivery.

The design of the foregoing multi-stage MMIC power amplifier has required a sequential synthesis, analysis and optimization of the three matching networks. It has not been straight forward The first stage in the design has been to synthesize the output network which will transform the 50 ohms required at the signal output to the large signal load impedance required at the power transistor manifolds. The most accurate methodology, that is applicable to optimum efficiency and other classes of operation of active devices, is to use the load pull method where the device is tuned with variable tuners, automated to search for optimum conditions. The optimum load at the fundamental can then be determined by measuring the impedance of the tuners and de-embedding the device. The measurements indicated an output conductance for optimum transfer power that is lower than that predicted by simple load line concepts. As this impedance is very low Q, the realization of the output network with ideal elements achieved using network synthesis. The key to this portion of the design however, is approximating the ideal network with low loss real elements. In order to minimize the insertion loss, the capacitors were avoided, and a network is made entirely of relatively wide low impedance transmission lines. This selection was facilitated by the use of a substrate at a high dielectric constant (i.e. 37) barium titanate.

The interstage network is required to match the drain manifold of the driver transistor T1 to the gate manifold of the power transistor T2. Because the Q of the gate circuit is high, this cannot be accomplished over wide bandwidths assuming tuning centered on the operating band. As a consequence, it is necessary to select an interstage topology that has higher gain at frequencies where the drain of the driver is poorly large signal matched. Using load pull data it is possible to see if a good compromise has been reached. The procedure is accomplished by evaluating small signal interstage gain, and ensuring that it exceeds with some margin the sum of the ratio of output to input device periphery and the estimated load pull of the input device. The latter is estimated by calculating the complex normalized reflection coefficient between the large signal drain impedance of the input device with respect to the small signal input impedance of the interstage and estimating load pull based on device measurements. Finally, the input network is designed to flatten small signal gain and improve input impedance match. Once these networks are synthesized, they are optimized individually to accommodate the changes due to the non-unilateral nature of the MESFET device and fine tune the design.

The final result has been a wideband high power amplifier having a performance exceeding that known heretofore, and having a design which has been conservative from a yield stand point.

What is claimed is:

1. A power amplifier for operation over a broad band of frequencies above 1 GHZ and at power levels in tens of watts, comprising,
   A) an input terminal for connection to an RF signal source having a resistive 50 ohm impedance,
   B) a monolithic microwave integrated circuit (MMIC) formed on a first monocrystalline semiconducting substrate 11 comprising (1) a driver stage comprising
  (i) a FET driver transistor (T1) subdivided into two parallel operated transistor cells (TC1, TC2), each cell having a rectangular configuration with interdigitated source, drain, and gate segments, a gate segment manifold being placed to one side of each cell, a drain segment manifold being placed to the other side, and a source segment manifold, formed of a linear air bridge spanning each cell and making ground contact at the to and bottom of each cell, the cellular configuration providing improved device efficiency and raising the input impedance above a minimum of a few (i.e. 4–10) ohms to facilitate an efficient match to said source over said broad band with reasonable signal gain, each cell having a high Q input impedance with significant shunt capacitance, resulting in a falling signal gain through said broad band and a low Q output impedance whose resistive component is several (i.e. 2–4) times greater than said input resistance,
  (ii) an input network having an input connection to said signal input terminal and fanned out to provide separate output connections to said two gate manifolds,
each path through said input network comprising four serial sections, each contributing to an impedance reducing transformation to minimize return loss (S11) and each exhibiting resonance with staggered tuning to preemphasize the upper portion of s id broad band to offset decreasing transistor gain while sustaining reasonable stage signal gain (S21) over said broad band,
(2) an output power stage comprising
  (i) a FET power transistor (T2) subdivided into four parallel operated transistor cells (TC3, TC4, TC5, TC6), each cell having a rectangular configuration with interdigitated source, drain and gate segments, a gate segment manifold being placed to one side of the cell, a drain manifold being placed on the other side, and a source segment manifold, formed of a linear air bridge spanning each cell and making ground contact at the top and bottom of each cell, the cellular configuration providing improved device efficiency and raising the input impedance above a minimum of several (i.e. 2–5) ohms to facilitate an efficient match to the driver stage over said broad band with reasonable signal gain, each cell having a high Q input impedance with significant shunt capacitance, resulting in a falling signal gain through said broad band and a low Q output impedance whose resistive component is several (i.e. 2–4) times greater than said input resistance,
  (ii) an interstage network having two parallel input connections, one to each of the drain manifolds of said driver transmitter and fanned out to provide four separate output connections, one to each of the gate manifolds of said power transistors,
each path through said interstage network comprising four serial sections, each contributing to an impedance reducing transformation to improve the power match between driver transistor drain manifolds and power transistor gate manifolds and each exhibiting resonance with staggered tuning to preemphasize the upper portion of said broad band to offset decreasing transistor gain while sustaining reasonable stage signal gain (S21) over said broad band, and
C) an output terminal for connection to an RF load having a resistive 50 ohm impedance,
D) an output network formed upon a second substrate (11) adjacent to said first substrate (10), having an underlying ground plane, a central insulating layer of a material having a dielectric constant at least equal to that of said first substrate, and a patterned metallization on the upper surface thereof for formation of said network,
said output network having four input connections, one to each of the drain manifolds of said power transistor and fanning in to a single output path connected to said output terminal, each path through said output network comprising four serial sections, each contributing to an impedance increasing transformation and each exhibiting resonance with staggered tuning to achieve a b road b and impedance match for a reflectionless power transfer (S22) to said RF load.

2. The power amplifier set forth in claim 1 wherein a first transmission line, a resistor and a second transmission line, like said first transmission line, are serially connected between the drain manifolds of the cells of said driver transistor, and between the drain manifolds of said first and second; second and third, and third and fourth cells of said power transistor, to absorb energy from said drain manifolds when differences in signal voltage occur between them to prevent push-pull instability.

3. The power amplifier set forth in claim 1 wherein
A) the four drain manifolds of the power transistor are arranged in a line at a first edge of said first substrate, and the four input connections of said output network are arranged in a line on an edge of said second substrate, adjacent said first edge,
B) said second substrate is of approximately the same thickness as said first substrate to facilitate reliable interconnection between said drain manifolds and said four input connection of said output network, and
C) the dielectric constant of the central insulating layer of said second substrate is greater than that of said first substrate, to facilitate widened transmission line sections of greater width, to minimize dissipation in said output network, while matching the drain impedances of said power transistor T2 and maintaining a center to center spacing equal to that of said power transistor cells for direct low impedance connections.

4. The power amplifier set forth in claim 3 wherein
A) said first transmission line section of said output network includes a first set of four parallel metallizations,
B) said second transmission line section includes of a second set of four parallel metallizations stepped down in width from said first set to step up the impedance, and internally stepped down in width to a first pair of fan in nodes, to step up the impedance further at entrance to the node, and having in addition thereto
C) a pair of filters for the power transformer drain bias supply, one connected between one fan-in node and a power transistor drain bias pad and the other connected between the other fan-in node and another power transistor drain bias pad, each filter comprising a transmission line of approximately one quarter wave electrical length, and a radial stub dimensioned to provide a low impedance to ground over said broad band, said quarter wave transmission line transforming said low impedance to a high impedance, to prevent broad band signals from entering said drain bias pad.

5. The power amplifier set forth in claim 4 wherein each power transistor drain bias filter for said power stage is a two section filter, the second section having a low pass response and comprising a serial inductor and a shunt capacitor for preventing signals well below said band from entering the drain bias pads for said power transistor.

6. The power amplifier set forth in claim 5 in which in the second section of each power transistor drain bias filter, the serial inductor is the self inductance of the connection between the first filter section upon said second substrate, and said shunt capacitor of said second filter section, which is spaced from said substrate.

7. The power amplifier set forth in claim 5 wherein said interstage network comprises a two section power transistor gate bias filtering means, the first section having a low pass characteristic and comprising a transmission line providing a serial inductance and a shunt capacitor for preventing signal feedback, and the second section having a low pass characteristic with a cut-off frequency well below said broad band and comprising a serial resistor, a serial inductor and a shunt capacitor for preventing low frequency instability.

8. The power amplifier set forth in claim 5 wherein said interstage network comprises a pair of two section power transistor gate bias filter means, one filter means being coupled between the gate manifold of one (TC3) of a first pair of power cells (TC3, TC4) and one of two power transistor gate bias pads and the other filter means being coupled between the gate manifold of one (TC6) of a second pair of power cells (TC5, TC6) and the other power transistor gate bias pad, the first section of each filter means comprising a transmission line providing a serial inductance and a shunt capacitor having a low pass response for preventing signal feedback, and the second section of each filter means having a low pass response with a cut-off frequency well below said band and comprising a serial resistor, a serial inductor and a shunt capacitor for preventing low frequency instability.

9. The power amplifier set forth in claim 8 wherein said interstage network further provides A) a pair of DC paths between gate manifolds of each pair of power cells traversing said second filter section to the gate bias pads to insure low frequency stability for all four power cells, and wherein B) the serial inductance of said first filter section of each power transistor gate bias filter means is proportioned to compensate for the shunt capacitance at the gate manifold to which it is connected to form a parallel resonant circuit peaking at a frequency near the upper portion of said broad band to flatten the stage frequency response, and having in addition thereto:

C) a second pair of transmission lines each providing a series inductance, one transmission line having one terminal coupled to the gate manifold of the other of said first pair of power cells and the other terminal capacitively bipassed to ground, and the other transmission line having one terminal coupled to the gate manifold of the other of said second pair of power cells and the other terminal capacitively bypassed to ground, and a resistor connected between said other transmission line terminals, the two last recited inductance/capacitance/resistance combinations forming two parallel resonant circuits peaking at a frequency near the upper portion of said broad band, for equalizing the frequency response between all four gate manifolds and flatten the stage frequency response.

10. The power amplifier set forth in claim 9 in which in the second section of each power transistor gate bias filter means the serial inductor is the self inductance of the connection to the first filter section upon said first substrate and the shunt capacitor of said second filter section, which is spaced from said substrate.

11. The power amplifier set forth in claim 9 wherein said interstage network comprises a pair of two section driver stage drain bias filter means, one filter means being coupled between the drain manifold of one (TC1) driver cell and one of two driver stage drain bias pads and the other filter mean being coupled between the drain manifold of the other (TC2) driver cell and the other of two driver stage drain bias pads, the first section of said filter means comprising a transmission line providing a serial inductance and a shunt capacitor having a low pass response, and the second section of each filter means having a low pass response with a cut-off frequency well below said band and comprising a serial inductor and a shunt capacitor for preventing instability.

12. The power amplifier set forth in claim 11 in which in the second section of each driver transistor drain bias filter means, the serial inductor is the self inductance of the connection between said first filter section upon said second substrate and the shunt capacitor of said second filter section, which is spaced from said substrate.

13. The power amplifier set forth in claim 11 wherein said input network comprises a two section driver transistor gate bias filter DC connected between both driver transistor gate manifolds and a driver transistor gate bias pad, the first section of said gate bias filter having a low pass characteristic and comprising a transmission line providing a serial inductance and a shunt capacitor for preventing signal feedback, and the second section having a low pass characteristic with a cut-off frequency well below s id broad band and comprising a serial resistor, a serial inductor and a shunt capacitor for preventing low frequency instability.

14. The power amplifier set forth in claim 13 in which in the second section of the driver transistor gate bias filter, the serial inductor is the self inductance of the connection between said first filter section upon said first substrate and the shunt capacitor of said second filter section, which is spaced from said substrate.

15. The power amplifier set forth in claim 13 wherein in said input filter, the first section includes an impedance reducing tapped inductance equivalent, the second section includes an impedance reducing tapped capacitance, the third section leading to a fan-out node includes a impedance reducing tapped inductance equivalent, and the fourth section contains a pair of short transmission lines one connected between said fan-in node and one driver gate manifold and the other connected between said fan-in node and the other driver gate manifold, each transmission line providing a serial inductance for compensating for gate capacitance.

16. The power amplifier as set forth in claim 15 wherein in said input filter, the self inductance of the input connection to said signal input terminal forms the upper portion of said tapped inductance equivalent of said first section, and wherein said transmission line in the first section of said driver transistor gate bias filter provides a shunt inductance forming the lower portion of said tapped inductance equivalent of said third section.

* * * * *